United States Patent
Liu et al.

(10) Patent No.: US 9,741,727 B2
(45) Date of Patent: Aug. 22, 2017

(54) SEMICONDUCTOR MEMORY WITH U-SHAPED CHANNEL

(71) Applicant: SU ZHOU ORIENTAL SEMICONDUCTOR CO., LTD., Suzhou, Jiangsu (CN)

(72) Inventors: Wei Liu, Jiangsu (CN); Lei Liu, Jiangsu (CN); Pengfei Wang, Jiangsu (CN); Yi Gong, Jiangsu (CN)

(73) Assignee: Su Zhou Oriental Semiconductor Co., Ltd., Suzhou (CN)

( * ) Notice: Subject to any disclaimer, the term of this patent is extended or adjusted under 35 U.S.C. 154(b) by 0 days.

(21) Appl. No.: 14/647,383

(22) PCT Filed: Apr. 1, 2014

(86) PCT No.: PCT/CN2014/074530
§ 371 (c)(1),
(2) Date: May 26, 2015

(87) PCT Pub. No.: WO2014/166346
PCT Pub. Date: Oct. 16, 2014

(65) Prior Publication Data
US 2015/0318291 A1    Nov. 5, 2015

(30) Foreign Application Priority Data
Apr. 9, 2013  (CN) .......................... 2013 1 0119651

(51) Int. Cl.
*H01L 29/788*  (2006.01)
*H01L 29/76*   (2006.01)
(Continued)

(52) U.S. Cl.
CPC .. *H01L 27/11521* (2013.01); *H01L 21/28273* (2013.01); *H01L 27/0629* (2013.01);
(Continued)

(58) Field of Classification Search
CPC ........... H01L 21/02532; H01L 21/2652; H01L 21/823412; H01L 21/22; H01L 21/225;
(Continued)

(56) References Cited

U.S. PATENT DOCUMENTS 5,854,501 A * 12/1998 Kao .................. H01L 29/42336
257/316
7,400,013 B1    7/2008 Ariyoshi
(Continued)

FOREIGN PATENT DOCUMENTS

CN    101005078 A    7/2007
CN    101494222 A    7/2009
(Continued)

OTHER PUBLICATIONS

Espacenet English abstract of CN 101005078 A.
Espacenet English abstract of TW 201308522 A1.

*Primary Examiner* — Natalia Gondarenko
(74) *Attorney, Agent, or Firm* — Ladas & Parry LLP (57) ABSTRACT

A semiconductor memory with a U-shaped channel comprises: a U-shaped channel region arranged in a semiconductor substrate, a source region, a drain region, a first layer of insulation film arranged on the U-shaped channel region, a floating gate provided with a notch, a second layer of insulation film, a control gate, a p-n junction diode arranged between the floating gate and the drain region, and a gate controlled diode formed by the control gate, the second layer of insulation film, and the p-n junction diode and using the control gate as a gate. Under the precondition of not increasing the manufacturing cost and difficulty of the semiconductor memory with a U-shaped channel and not affecting the performance of the semiconductor memory with a U-shaped channel, the dimension of a semiconductor stor- (Continued)

age device is further reduced and the chip density is increased by arranging the notch in the floating gate.

15 Claims, 5 Drawing Sheets

(51) Int. Cl.
| | |
|---|---|
| *H01L 27/11521* | (2017.01) |
| *H01L 29/423* | (2006.01) |
| *H01L 27/06* | (2006.01) |
| *H01L 29/49* | (2006.01) |
| *H01L 29/10* | (2006.01) |
| *H01L 21/28* | (2006.01) |
| *H01L 29/66* | (2006.01) |
| *H01L 21/336* | (2006.01) |
| *H01L 27/07* | (2006.01) |

(52) U.S. Cl.
CPC .... *H01L 29/1037* (2013.01); *H01L 29/42324* (2013.01); *H01L 29/42336* (2013.01); *H01L 29/42364* (2013.01); *H01L 29/4916* (2013.01); *H01L 29/66825* (2013.01); *H01L 29/7881* (2013.01); *H01L 27/0727* (2013.01)

(58) Field of Classification Search
CPC ............ H01L 21/2256; H01L 21/2253; H01L 21/28176; H01L 29/0878; H01L 29/66; H01L 29/66636; H01L 29/66666; H01L 29/66795; H01L 29/66825; H01L 29/66477; H01L 29/78618; H01L 29/78; H01L 29/785; H01L 27/0924; H01L 27/092; H01L 27/088; H01L 27/0886; H01L 27/12; H01L 21/2818; H01L 21/823807; H01L 21/8234; H01L 21/8238; H01L 21/823821; H01L 21/823814; H01L 21/84; H01L 27/11521; H01L 27/0629; H01L 27/0727; H01L 21/28273; H01L 29/42364; H01L 29/42324; H01L 29/42336; H01L 29/78696; H01L 27/11517–27/1156; H01L 29/788–29/7889; H01L 29/41791; H01L 29/66621; H01L 29/772; H01L 21/823431; H01L 21/845; H01L 21/823437; H01L 21/823842; H01L 2924/0002

USPC .... 257/315, 347, 330, 332, 500, 316, E29.3, 257/314; 438/585, 257

See application file for complete search history.

(56) References Cited

U.S. PATENT DOCUMENTS

| | | | |
|---|---|---|---|
| 2004/0232473 A1* | 11/2004 | Hsu .................. | H01L 29/66825 257/315 |
| 2005/0045940 A1 | 3/2005 | Chen et al. | |
| 2007/0133292 A1* | 6/2007 | Liao ...................... | B82Y 10/00 365/185.18 |
| 2008/0087945 A1* | 4/2008 | Forbes ................... | C23C 16/308 257/325 |
| 2009/0185426 A1* | 7/2009 | Wang ..................... | G11C 11/404 365/185.18 |

FOREIGN PATENT DOCUMENTS

| | | |
|---|---|---|
| CN | 101764156 A | 6/2010 |
| CN | 101494222 B | 8/2010 |
| CN | 103915439 A | 7/2014 |
| CN | 104103678 A | 10/2014 |
| KR | 10-2006-0089530 A | 8/2006 |
| TW | 201308522 A1 | 2/2013 |
| WO | 2014/108065 A1 | 7/2014 |

\* cited by examiner

SEMICONDUCTOR MEMORY WITH U-SHAPED CHANNEL

RELATED APPLICATION

This application is a national phase entry under 35 USC 371 of International Patent Application No PCT/CN2014/074530 filed on 1 Apr. 2014, which claims priority from Chinese Patent Application No. 201310119651.8 filed on 9 Apr. 2013, the disclosures of which are incorporated in their entirety by reference herein.

FIELD OF THE INVENTION

The present invention pertains to the field of semiconductor memory technologies, relates to a dynamic random access memory, and in particular, relates to a U-shaped channel semiconductor memory.

DESCRIPTION OF RELATED ART

Semiconductor memories are widely used in many electronic products. There are different requirements for the construction, performance, and density of the semiconductor memory in different application fields. For example, a static random access memory (SRAM) has a very high random access speed and a relatively low integration density, while a standard dynamic random access memory (DRAM) has a very high integration density and a moderate random access speed. Currently, with the continuous expansion of the market demand for semiconductor memories, the dynamic random access memory technologies are in accelerated development and many problems which restrain the application of dynamic random access memory products are being solved.

Chinese Patent Application No. 200810043070.X discloses a "Semiconductor Memory Device, Semiconductor Memory Array, and Write Method". The semiconductor memory device includes a source, a drain, a floating gate region, a control gate, a recessed channel region (also referred to as a U-shaped channel region), and a gated p-n junction diode for connecting the floating gate region and the drain. A floating gate of the semiconductor memory device is configured to store charge and may be charged or discharged through the gated p-n junction diode. The semiconductor memory adopts a recessed channel structure and has advantages of increasing the length of a current channel region between a source region and a drain region and reducing the size of the chip, but also has the following disadvantages: first, the source region and drain region of the semiconductor memory are recessed into a semiconductor substrate and a contact of the drain is used as a control gate of the gated p-n junction diode, so the compatibility between the semiconductor memory and a logic circuit is poor; second, the floating gate is only located in a U-shaped groove, so the capacitive coupling effect of the control gate applied on the floating gate is only an opening region of the U-shaped groove, and the area is small, reducing a capacitive coupling ratio of the control gate to the floating gate, thereby increasing an operating voltage of the control gate and reducing the reliability of the operation of the semiconductor memory.

Figure 1:
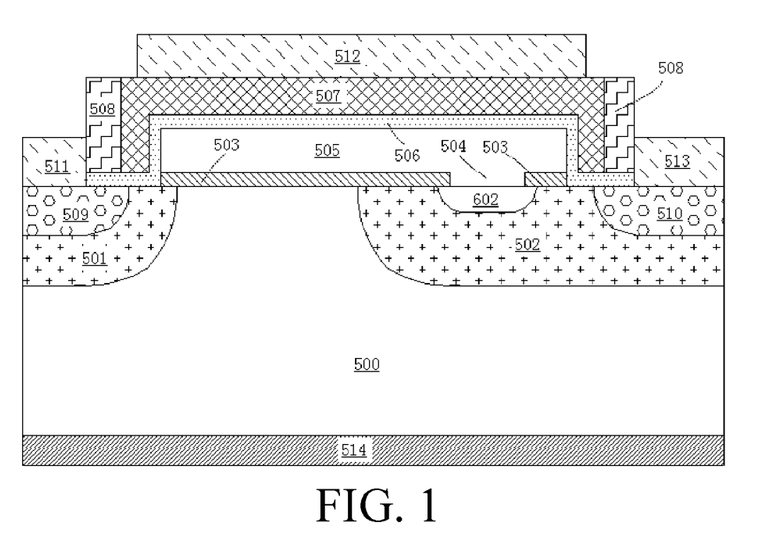
FIG. 1 is a schematic cross-sectional diagram of a planar channel semiconductor memory of Chinese Patent Application No. 201310006320.3.

To overcome the disadvantages of the prior art, Chinese Patent Application No. 201310006320.3 discloses "A Planar Channel Semiconductor Memory", as shown in FIG. 1, which includes: a source region 501, a drain region 502, and a planar channel region 601 formed in a semiconductor substrate 500. A first layer of insulating film 503 and a floating gate 505 are formed above the source region 501, the channel region 601, and the drain region 502. A p-n junction diode is formed between the floating gate 505 and the drain region 502 via a floating gate opening region 504. A second layer of insulating film 506 and a control gate 507 are formed, covering the floating gate 505 and the p-n junction diode structure. Advantages of the semiconductor memory lie in that: a floating gate is adopted to store information, a gated p-n junction diode which uses the control gate as a gate is used to charge or discharge the floating gate, the semiconductor memory is compatible with a logic circuit, and the control gate covers the floating gate at positions of an upper surface and both sides of the floating gate, thereby being capable of effectively enlarging a contact area between the control gate and the floating gate; therefore, the capacitive coupling ratio of the control gate to the floating gate can be improved and only a low operating voltage is needed for data read or write. However, the semiconductor memory also has the following disadvantages: first, to ensure performance of the planar channel semiconductor memory, it is not only necessary to extend the length of a current channel region between the source region and the drain region, but also necessary to extend the length of a current channel region of a parasitic MOS transistor between the floating gate and the current channel region, so that the unit area of the semiconductor memory is increased, thereby reducing the chip density, which is disadvantageous to the miniaturization development of chips.

A further optimized solution to the prior art is: Chinese Patent Application No. 201310111150.5 discloses "A U-shaped Channel Semiconductor Device and a Method for Manufacturing the Same". The semiconductor device includes at least a semiconductor substrate, a source region, a drain region, a floating gate, a control gate, a U-shaped channel region, and a gated p-n junction diode for connecting the floating gate and the drain region. The U-shaped channel semiconductor device has advantages of both an existing semiconductor memory of a planar channel structure and a semiconductor memory of a U-shaped channel structure and well solves the problems of the poor compatibility between the semiconductor memory of the U-shaped channel structure and a logic circuit and the low operation reliability, but also has the following disadvantages: first, the capacitive coupling ratio of a control gate to a floating gate can be improved by extending the length at which the floating gate covers the source region and the drain region on both sides of a U-shaped groove, but to some extent, the size of the semiconductor memory is increased and the chip density is reduced; second, the corresponding area of the control gate on a side wall of the floating gate can be enlarged by increasing the thickness of the floating gate, so as to increase the capacitive coupling ratio of the control gate to the floating gate, but the time and materials for preparation of the floating gate are increased, thereby raising the manufacturing cost, and also a step height of the floating gate is also increased, thereby being apt to lead to a problem about a step coverage ratio and increasing the difficulty of the process.

SUMMARY OF THE INVENTION

Technical Problem

An objective of the present invention is to provide a U-shaped channel semiconductor memory to overcome the disadvantages of the prior art. In the present invention, a notch in which a control gate is provided is formed on a top of a floating gate on one side of a source region. Therefore, the size of the semiconductor memory device can be further reduced and the chip density can be improved without increasing the cost and difficulty for manufacturing the U-shaped channel semiconductor memory.

Technical Solution

To achieve the objective of the present invention, the present invention provides a U-shaped channel semiconductor memory, which includes:

a semiconductor substrate of a first doping type provided with a U-shaped channel region;

a source region and a drain region both of a second doping type provided in the semiconductor substrate, the U-shaped channel region being provided between the source region and the drain region;

a first layer of insulating film disposed on the U-shaped channel region, the first layer of insulating film extending to a horizontal surface of the drain region;

a floating gate opening region provided in the first layer of insulating film, the floating gate opening region being located on a side wall of the drain region on a top of the U-shaped channel region;

a floating gate of the first doping type covering the first layer of insulating film and the floating gate opening region; and a p-n junction diode between the floating gate and the drain region;

where the U-shaped channel semiconductor memory further includes:

a notch of the floating gate provided between a top of the floating gate and the source region, and a second layer of insulating film covering a side wall of the source region on the top of the U-shaped channel region and the floating gate, the second layer of insulating film extending towards both sides of the U-shaped channel region to the source region and the p-n junction diode; and a control gate covering the second layer of insulating film, the control gate, the second layer of insulating film, and the p-n junction diode forming a gated diode which uses the control gate as a gate.

A further optimized solution of the present invention lies in:

In the present invention, if the first doping type is n-type and the second doping type is p-type, a cathode of the gated diode is connected to the floating gate and an anode of the gated diode is connected to the drain region.

In the present invention, if the first doping type is p-type and the second doping type is n-type, an anode of the gated diode is connected to the floating gate and a cathode of the gated diode is connected to the drain region.

The material of the first layer of insulating film of the present invention is silicon dioxide, silicon nitride, silicon oxynitride, hafnium oxide, or an insulating material with a high dielectric constant, and the physical thickness of the first layer of insulating film is 1-20 nm.

The material of the second layer of insulating film of the present invention is silicon dioxide, silicon nitride, silicon oxynitride, hafnium oxide, or an insulating material with a high dielectric constant, and the physical thickness of the second layer of insulating film is 1-20 nm.

The material of the floating gate of the present invention is polycrystalline silicon.

The material of the control gate of the present invention is metal, alloy, or doped polycrystalline silicon.

Advantageous Effect

Compared with the prior art, the prominent advantages of the present invention lie in:

First, in the present invention, a notch is formed on the top of the floating gate on one side of the source region, and in this way, the floating gate only extends to a horizontal surface of the drain region, the size of the U-shaped channel semiconductor memory can be further reduced, and the chip density can be improved.

Second, in the present invention, a control gate is provided in the notch on the top of the floating gate on one side of the source region, and the control gate covers the floating gate at positions of the top and both sides of the floating gate; although a capacitive coupling area of the control gate to the floating gate is reduced in the horizontal direction, a capacitive coupling area of the control gate to the floating gate is increased on one side wall of the notch; as a result, the total capacitive coupling ratio of the control gate to the floating gate can be improved without increasing the thickness of the floating gate.

Third, the notch located between the top of the floating gate and the source region is equivalent to a groove structure, and a bottom of the control gate is formed in the groove; as a result, the influence of the step coverage rate problem can be reduced; therefore, the difficulty of the manufacturing process of the present invention can be reduced.

DETAILED DESCRIPTION OF THE INVENTION

To clearly illustrate the detailed implementation manners of the present invention, the thickness of the layers and regions of the present invention are amplified and the size of the listed patterns do not represent the actual size in the accompanying drawings of the description. The accompanying drawings are schematic and should not limit the scope of the present invention. The embodiments listed in the description are not limited by the special shapes of the regions shown in the accompanying drawings, but should include other obtained shapes, for example, deviations caused during the manufacturing process, or curves obtained by etching that usually have bent or round characteristics but are all represented by rectangles in the embodiments of the present invention.

The following further describes the detailed implementation manners of the present invention in combination with the accompanying drawings and the embodiments.

Figure 2:
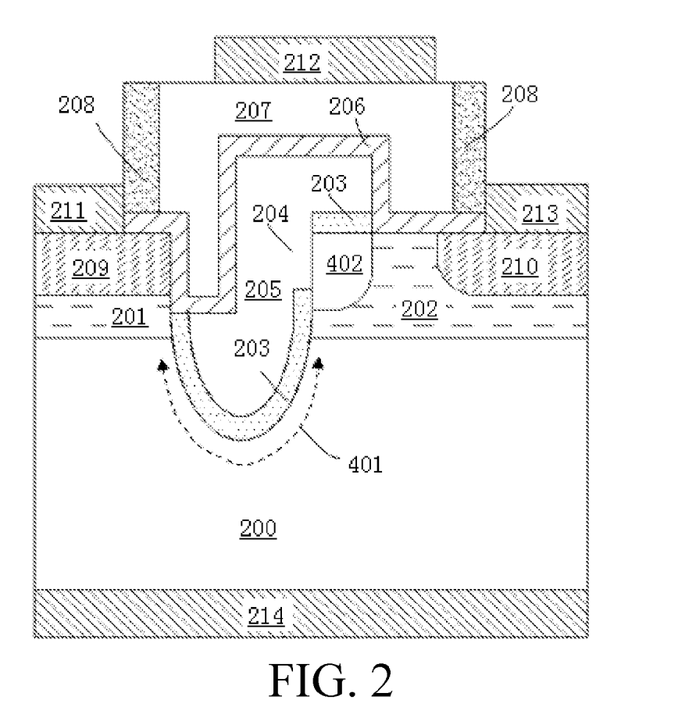
FIG. 2 is a schematic cross-sectional diagram of an embodiment of a U-shaped channel semiconductor memory provided in the present invention.

FIG. 2 is a cross-sectional diagram of an embodiment of a U-shaped channel semiconductor memory in the length direction of a current channel of the semiconductor memory provided in the present invention. As shown in FIG. 2, the U-shaped channel semiconductor memory provided in the present invention includes: a semiconductor substrate 200 of a first doping type and a source region 201 and a drain region 202 of a second doping type formed in the semiconductor substrate 200, where the material of the semiconductor substrate 200 is monocrystalline silicon, polycrystalline silicon, or silicon on an insulator, and the first doping type is n-type and the second doping type is p-type, or the first doping type is p-type and the second doping type is n-type; and a U-shaped groove recessed into the semiconductor substrate 200 and formed between the source region 201 and the drain region 202, where a U-shaped channel region 401 of the device is formed on a surface of the U-shaped groove in the semiconductor substrate, and the U-shaped channel region 401 is an inversion-type layer formed in the semiconductor substrate 200 during the operation of the U-shaped channel semiconductor device.

A first layer of insulating film 203 covering the whole U-shaped channel region 401 and extending to a horizontal surface of the drain region 202 is formed. A floating gate opening region 204 is formed in the first layer of insulating film 203 on the side wall located on a top of the U-shaped groove and close to one side of the drain region 202. The material of the first layer of insulating film 203 is silicon dioxide, silicon nitride, silicon oxynitride, hafnium oxide, or an insulating material with a high dielectric constant, and the physical thickness of the first layer of insulating film 203 is 1-20 nm.

A floating gate 205 of the first doping type used as a charge storage node is formed, covering the first layer of insulating film 203 and the floating gate opening region 204. One side of the floating gate 205 close to the source region 201 is located in the U-shaped groove, and a notch is provided on a top of the floating gate. The other side of the floating gate 205 exceeds the U-shaped groove and covers a portion of the drain region 202. The floating gate 205 has a doping type opposite to that of the drain region 202 and doped impurities in the floating gate 205 may diffuse via the floating gate opening region 204 to the drain region 202 to form a diffusion region 402 of the first doping type. Therefore, a p-n junction diode is formed between the floating gate 205 and the drain region 202 via the floating gate opening region 204.

A second layer of insulating film 206 is formed, covering the source region 201, the floating gate 205, and the p-n junction diode. The material of the second layer of insulating film 206 is silicon dioxide, silicon nitride, silicon oxynitride, hafnium oxide, or an insulating material with a high dielectric constant, and the physical thickness of the second layer of insulating film 206 is 1-20 nm. A control gate 207 of the device is formed on the second layer of insulating film 206 and covers the floating gate 205. In the length direction of a current channel of the device, the control gate 207 isolates the source region 201 from the top of the floating gate 205 on the top of the formed U-shaped groove. The control gate 207 may be of metal, alloy, or doped polycrystalline silicon. The control gate 207, the second layer of insulating film 206, and the p-n junction diode form a gated diode which uses the control gate as a gate.

Gate side walls 208 of the device are further formed on both sides of the control gate 207. The material of the gate side walls 208 is silicon dioxide or silicon nitride. The gate side walls are a structure well-known in the art for isolating the control gate 207 from other conductive layers in the device.

A doped region 209 and a doped region 210 of the same doping type as the source region 201 and the drain region 202 are further formed in the source region 201 and the drain region 202, respectively. The doping concentration of the doped region 209 and the doped region 210 is higher than the doping concentration of the source region 201 and the drain region 202, for reducing the ohmic contact of the device.

The U-shaped channel semiconductor memory of the present invention may also include a contact 211 of the source region, a contact 212 of the control gate, a contact 213 of the drain region, and a contact 214 of the semiconductor substrate for connecting the source region, the control gate, the drain region, and the semiconductor substrate to external electrodes, where the contacts are formed of a conductive material.

The aforementioned U-shaped channel semiconductor memory disclosed in the present invention may be manufactured with many methods. With reference to FIG. 3 to FIG. 9, the following further describes specific steps of a process flow of an embodiment of the present invention according to the structure of the U-shaped channel semiconductor memory shown in FIG. 2.

Figure 3:
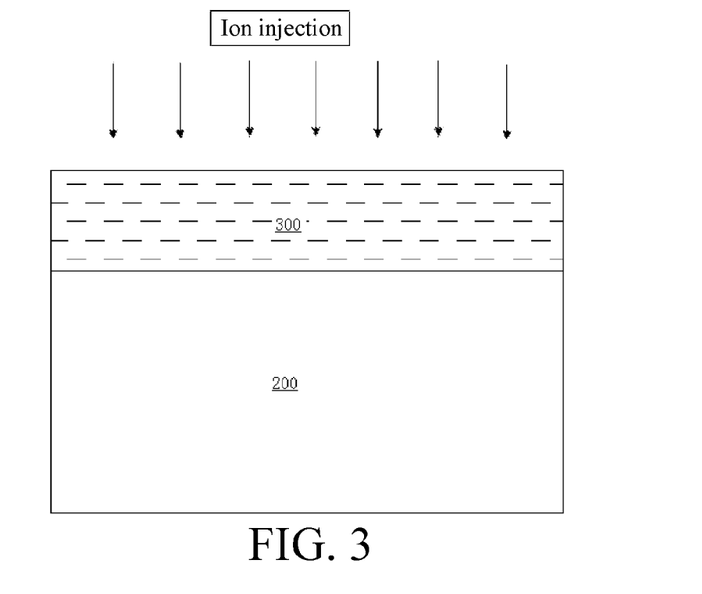
FIG. 3 to FIG. 9 are schematic flowcharts of an embodiment of a U-shaped channel semiconductor memory provided in the present invention.

Step 1: As shown in FIG. 3, an active region (not shown in FIG. 3) is formed in a provided semiconductor substrate 200 of a first doping type through a shallow trench isolation (STI) procedure. The STI process is well known in the art. Then, a lightly doped region 300 of a second doping type is formed in the semiconductor substrate 200 through an ion injection process, where the material of the semiconductor substrate 200 is monocrystalline silicon, polycrystalline silicon, or silicon on an insulator, the first doping type is p-type, and the second doping type is n-type.

Figure 4:
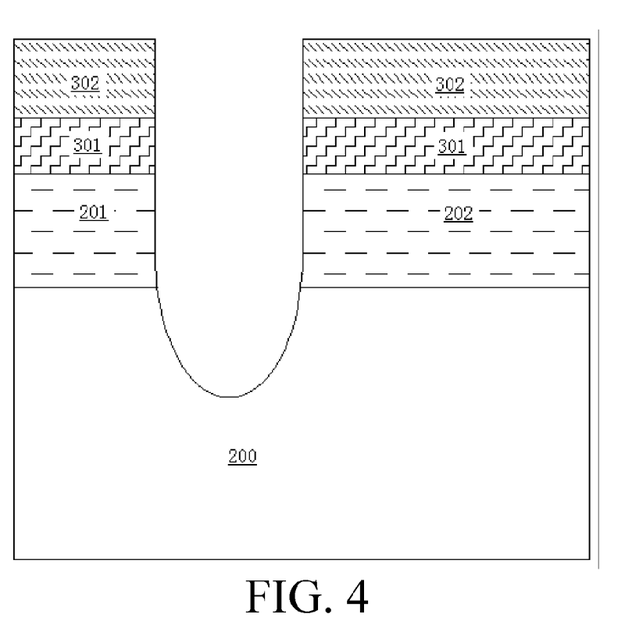

Step 2: A hard mask layer 301 is deposited on a surface of the semiconductor substrate 200. The material of the hard mask layer 301 is silicon nitride. Subsequently, a layer of photoresist 302 is deposited on the hard mask layer 301 and then a position of a U-shaped channel region of the device is defined through mask, exposure, and development. Then, the exposed hard mask layer 301 is etched off, and the exposed semiconductor substrate 200 is etched by using the hard mask layer 301 as a mask through a method integrating wet etching and dry etching, so as to form a U-shaped groove recessed into the semiconductor substrate 200, where the U-shaped groove divides the lightly doped region 300 of the second doping type into two parts, which are used as a source region 201 and a drain region 202 of the device, respectively, as shown in FIG. 4.

Figure 5:
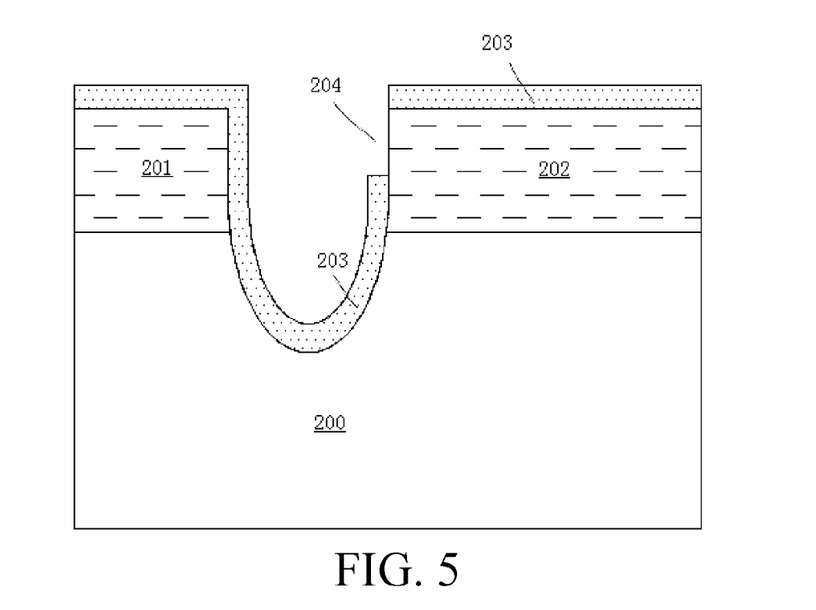

Step 3: The photoresist 303 is etched off and the remaining hard mask layer 301 is continuously etched off Subsequently, a first layer of insulating film 203 is grown on an exposed surface of the semiconductor substrate 200. The material of the first layer of insulating film 203 is an insulating material with a high dielectric constant such as silicon oxide, silicon nitride, silicon oxynitride, or hafnium oxide, and the physical thickness of the first layer of insulating film 203 is 1-20 nm. Subsequently, a floating gate opening region 204 is formed in the first layer of insulating film 203 on the top of the U-shaped groove and close to one side of the drain region 202, as shown in FIG. 5.

Figure 6:
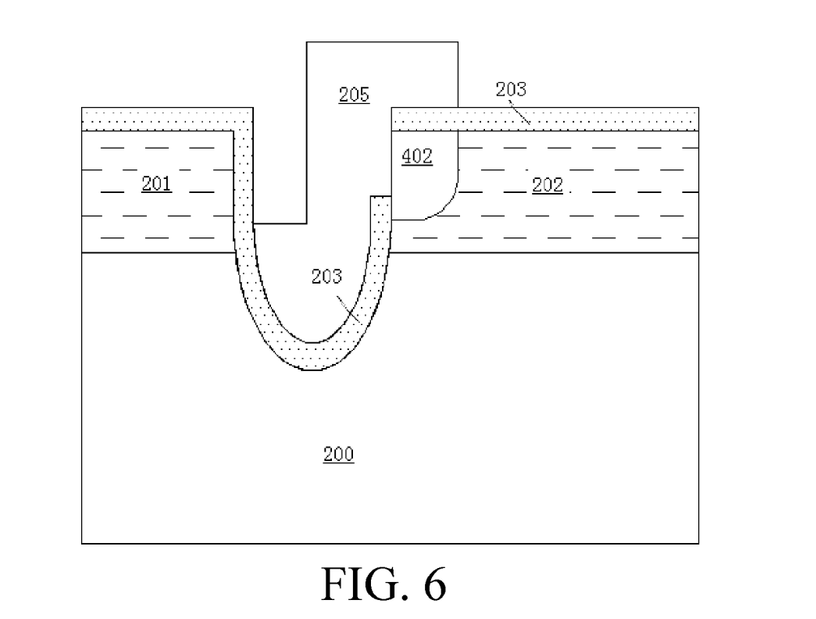

Step 4: A first layer of conductive film of the first doping type is deposited on an exposed surface of the formed structure. The conductive film is formed by polycrystalline silicon of a p-type doping type. Subsequently, a layer of photoresist is deposited on the formed first layer of conductive film and a position of a floating gate is determined through a photolithography process. Then, a part of the first layer of conductive film on the top of the U-shaped groove and close to the side of the source region is etched off by using the photoresist as a mask through control of etching conditions, the exposed first layer of conductive film in other positions is etched off, and after the etching, the remaining first layer of conductive film forms a floating gate 205 of the device. The floating gate 205 at least covers a bottom of the U-shaped groove and the floating gate opening region 204. Doped impurities in the floating gate 205 may diffuse via the floating gate opening region 204 to the drain region 202 to form a p-type diffusion region 402; and a p-n junction diode is formed between the floating gate 205 and the drain region 202 via the floating gate opening region 204. The structure after the photoresist is stripped off is as shown in FIG. 6.

Figure 7:
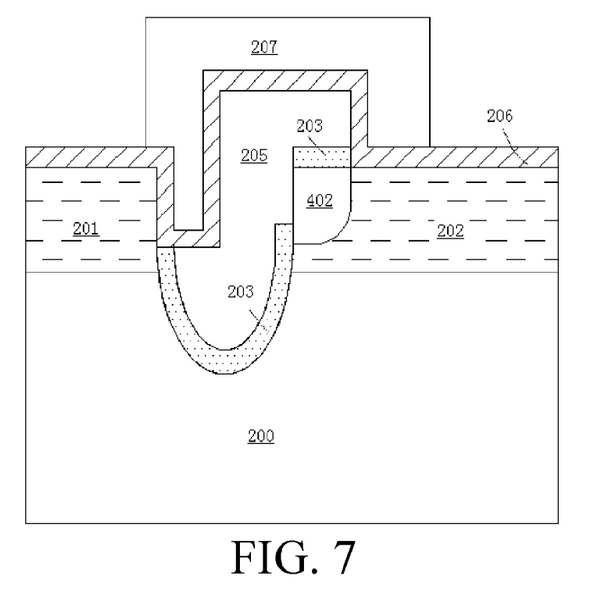

Step 5: The exposed first layer of insulating film 203 is etched off and a second layer of insulating film 206 is formed on an exposed surface of the formed structure. The material of the second layer of insulating film 206 is an insulating material with a high dielectric constant such as silicon oxide, silicon nitride, silicon oxynitride, or hafnium oxide, and the physical thickness of the second layer of insulating film 206 is 1-20 nm. Subsequently, a second layer of conductive film 207 is deposited on the second layer of insulating film 206. The material of the second layer of conductive film 207 is metal, alloy, or doped polycrystalline silicon. Then, a layer of photoresist is deposited on the second layer of conductive film 207 and a position of a control gate of the device is defined through a photolithography process. Subsequently, the exposed second layer of conductive film is etched off by using the photoresist as a mask, and after the etching, the remaining second layer of conductive film forms a control gate 207 of the device. The control gate 207 should exceed the floating gate 205 in the length direction of a current channel and cover the floating gate 205 at positions of a top and both sides of the floating gate 205. Moreover, the control gate 207 isolates the source region 201 from the top of the floating gate 205 on the top of the formed U-shaped groove. The structure after the photoresist is stripped off is as shown in FIG. 7.

Step 6: A third layer of insulating film is deposited on an exposed surface of the formed structure. Subsequently, etch back is performed on the formed third layer of insulating film and the exposed second layer of insulating film 206 is then etched off After the etching, the remaining third layer of insulating film forms gate side walls 208 on both sides of the control gate 207. The process is well known in the art. The material of the gate side walls 208 is silicon oxide or silicon nitride.

Figure 8:
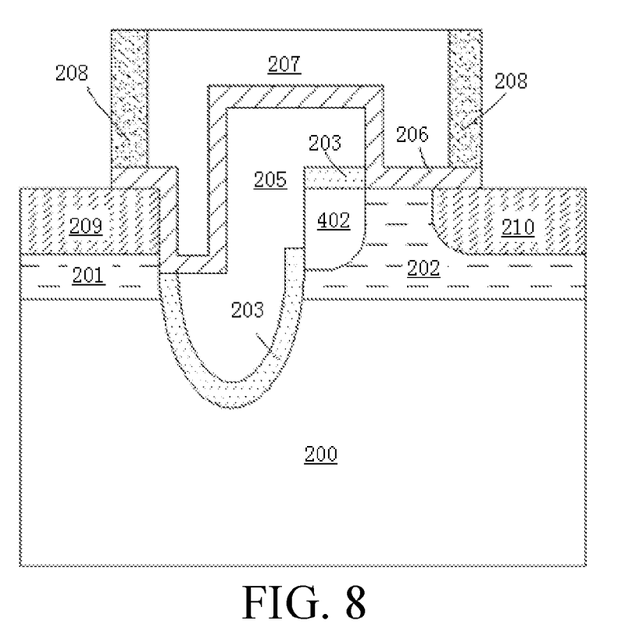

Step 7: Impurity ion injection of a second doping type (n-type) is performed. Doping is performed on the control gate 207 and a portion of the semiconductor substrate 200 which is not covered by the control gate 207, to form a doped structure of the control gate 207. High-concentration doped regions 209 and 210 are formed in the source region and drain region 201 and 202, respectively, as shown in FIG. 8.

Figure 9:
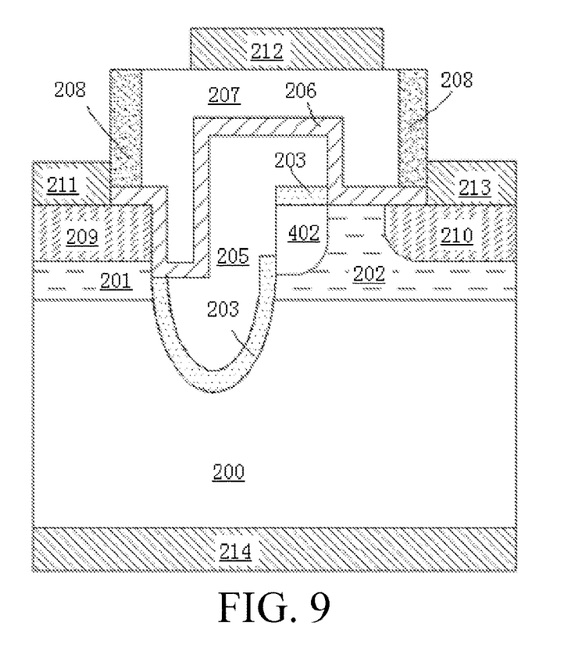

Step 8: A contact 211 of the source region, a contact 212 of the control gate, a contact 213 of the drain region, and a contact 214 of the semiconductor substrate for connecting the source region 201, the control gate 207, the drain region 202, and the semiconductor substrate 200 to external electrodes are formed by using a conductive material, as shown in FIG. 9.

Those not described in the detailed implementation manners of the present invention are common general knowledge in the art and can be implemented with reference to the common general knowledge.

The aforementioned detailed implementation manners and embodiments are detailed support to the technical concept of the U-shaped channel semiconductor memory provided in the present invention. However, the scope of protection of the present invention is not thus limited. Those equivalent variations or equal modifications proposed according to the technical concept of the present invention on the basis of this technical solution all fall into the scope of protection of the technical solution of the present invention.

What is claimed is:

1. A U-shaped channel semiconductor memory, comprising:
    a semiconductor substrate of a first doping type provided with a U-shaped channel region;
    a source region and a drain region both of a second doping type provided in the semiconductor substrate, the U-shaped channel region being provided between the source region and the drain region;
    a first layer of insulating film disposed on the U-shaped channel region, the first layer of insulating film extending to a horizontal surface of the drain region;
    a floating gate opening region provided in the first layer of insulating film, the floating gate opening region being located on a side wall of the drain region on a top of the U-shaped channel region;
    a floating gate of the first doping type covering the first layer of insulating film and the floating gate opening region; and
    a p-n junction diode between the floating gate and the drain region;
    wherein the U-shaped channel semiconductor memory further comprises:
    a control gate covering the second layer of insulating film, the control gate, the second layer of insulating film, and the p-n junction diode forming a gated diode which uses the control gate as a gate; and
    a notch of the floating gate provided between a top of the floating gate and the source region, the notch has a groove structure with asymmetrical position in the floating gate, wherein a side wall of the groove is in direct contact with the source region and an opposite side wall of the groove is in direct contact with the floating gate, a bottom of the control gate is formed in the groove, and a second layer of insulating film covering a side wall of the source region on the top of the U-shaped channel region and the floating gate, the second layer of insulating film extending towards both sides of the U-shaped channel region to the source region and the p-n junction diode.

2. The U-shaped channel semiconductor memory according to claim 1, wherein the first doping type is n-type and the second doping type is p-type, a cathode of the gated diode is connected to the floating gate and an anode of the gated diode is connected to the drain region.

3. The U-shaped channel semiconductor memory according to claim 1, wherein the first doping type is p-type and the second doping type is n-type, an anode of the gated diode is connected to the floating gate and a cathode of the gated diode is connected to the drain region.

4. The U-shaped channel semiconductor memory according to claim 1, wherein a material of the first layer of insulating film is silicon dioxide, silicon nitride, silicon oxynitride, hafnium oxide, or an insulating material with a high dielectric constant, and the first layer of insulating film has a physical thickness of 1-20 nm.

5. The U-shaped channel semiconductor memory according to claim 1, wherein a material of the second layer of insulating film is silicon dioxide, silicon nitride, silicon oxynitride, hafnium oxide, or an insulating material with a high dielectric constant, and the second layer of insulating film has a physical thickness of 1-20 nm.

6. The U-shaped channel semiconductor memory according to claim 1, wherein a material of the floating gate is polycrystalline silicon.

7. The U-shaped channel semiconductor memory according to claim 1, wherein a material of the control gate is metal, alloy, or doped polycrystalline silicon.

8. The U-shaped channel semiconductor memory according to claim 2, wherein a material of the first layer of insulating film is silicon dioxide, silicon nitride, silicon oxynitride, hafnium oxide, or an insulating material with a high dielectric constant, and the first layer of insulating film is has a physical thickness of 1-20 nm.

9. The U-shaped channel semiconductor memory according to claim 3, wherein a material of the first layer of insulating film is silicon dioxide, silicon nitride, silicon oxynitride, hafnium oxide, or an insulating material with a high dielectric constant, and the first layer of insulating film has a physical thickness of 1-20 nm.

10. The U-shaped channel semiconductor memory according to claim 2, wherein a material of the second layer of insulating film is silicon dioxide, silicon nitride, silicon oxynitride, hafnium oxide, or an insulating material with a high dielectric constant, and-the second layer of insulating film has a physical thickness of 1-20 nm.

11. The U-shaped channel semiconductor memory according to claim 3, wherein a material of the second layer of insulating film is silicon dioxide, silicon nitride, silicon oxynitride, hafnium oxide, or an insulating material with a high dielectric constant, and-the second layer of insulating film has a physical thickness of 1-20 nm.

12. The U-shaped channel semiconductor memory according to claim 2, wherein a material of the floating gate is polycrystalline silicon.

13. The U-shaped channel semiconductor memory according to claim 3, wherein a material of the floating gate is polycrystalline silicon.

14. The U-shaped channel semiconductor memory according to claim 2, wherein a material of the control gate is metal, alloy, or doped polycrystalline silicon.

15. The U-shaped channel semiconductor memory according to claim 3, wherein a material of the control gate is metal, alloy, or doped polycrystalline silicon.

* * * * *